United States Patent [19]
Kolkowski et al.

[11] Patent Number: 5,789,934
[45] Date of Patent: Aug. 4, 1998

[54] TEST CIRCUIT INCLUDING A POWER SUPPLY WITH A CURRENT TRANSFORMER TO MONITOR CAPACITOR OUTPUT CURRENT

[75] Inventors: John Kolkowski, Rockaway; James S. Gallo, New Providence, both of N.J.

[73] Assignee: Hewlett-Packard Company, Palo Alto, Calif.

[21] Appl. No.: 652,746

[22] Filed: May 23, 1996

[51] Int. Cl.$^6$ .................................................. G01R 31/02
[52] U.S. Cl. ........................................... 324/771; 324/537
[58] Field of Search ............................ 324/522, 537, 324/555, 713, 763, 771, 111

[56] References Cited

U.S. PATENT DOCUMENTS

| | | | |
|---|---|---|---|
| 4,369,407 | 1/1983 | Korbell | 324/416 |
| 4,868,509 | 9/1989 | Ury et al. | 324/547 |
| 4,906,937 | 3/1990 | Wikstrom et al. | 324/522 |
| 5,469,071 | 11/1995 | Obata | 324/713 |

Primary Examiner—Glenn W. Brown

[57] ABSTRACT

A measurement system is provided for the measurement of current supplied from a power source, wherein the power source provides a time-varying current, with certain portions thereof being supplied by discharge of an output capacitor. The measurement system includes a circuit for providing a supply voltage between a first terminal and a second terminal, with a sense resistor connected to the first terminal. A capacitor is coupled between the sense resistor and the second terminal and a current sensing circuit is coupled to the capacitor for sensing current flow therein and providing a first signal which is indicative thereof. At least one operational amplifier is coupled to the sense resistor and provides a signal that is indicative of voltage drop as a result of current flow therethrough. A summing amplifier is coupled to the current sense circuit and the operational amplifier and provides an output that is indicative of a sum of the first and second signals, thereby providing an indication of both power source output current and capacitor discharge current to a load connected between the first terminal and the second terminal.

5 Claims, 1 Drawing Sheet

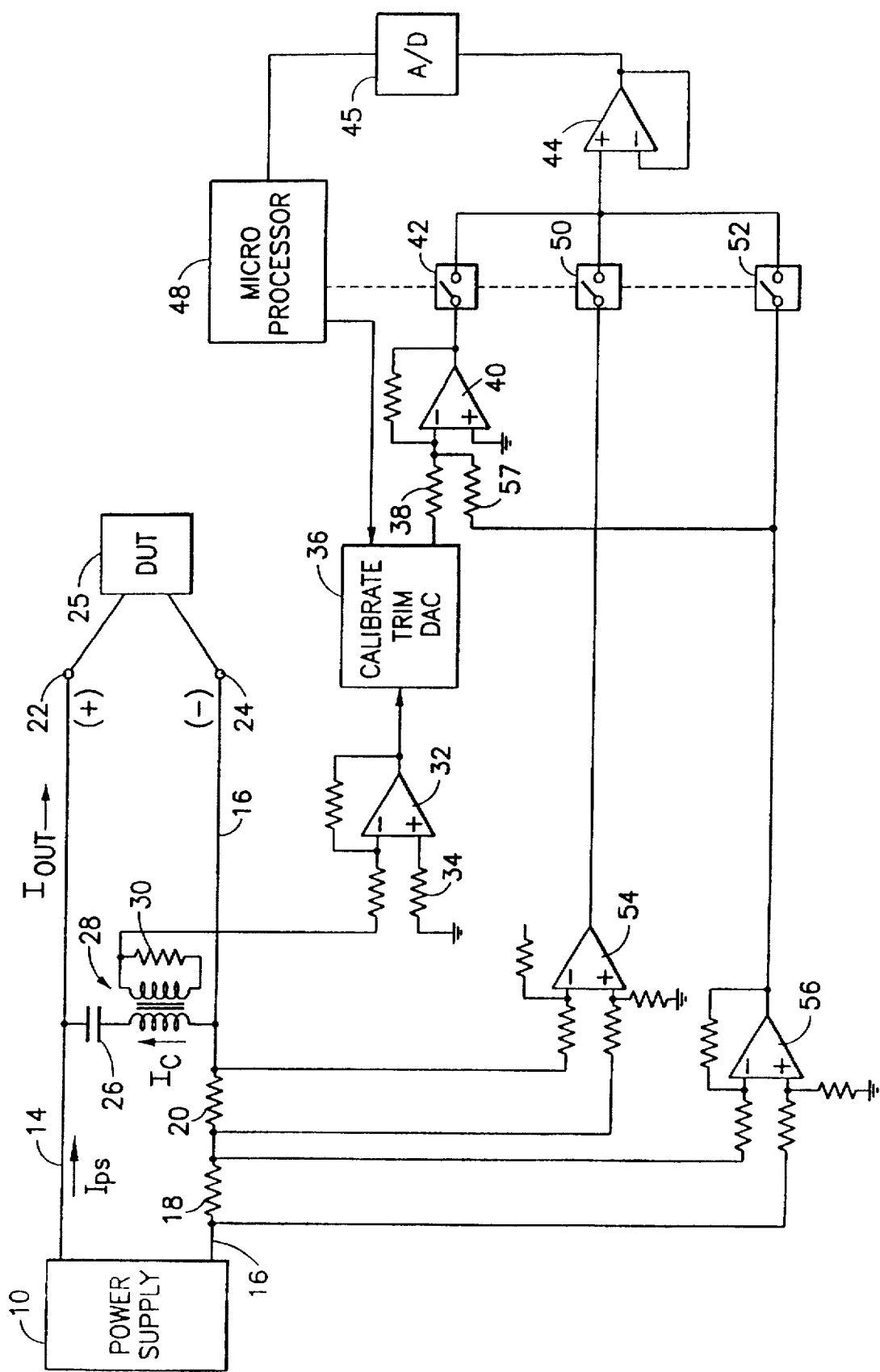

5,789,934

TEST CIRCUIT INCLUDING A POWER SUPPLY WITH A CURRENT TRANSFORMER TO MONITOR CAPACITOR OUTPUT CURRENT

FIELD OF THE INVENTION

This invention relates to power measurement circuits and, more particularly, to a power measurement circuit which includes apparatus for enabling measurement of both current flow from an included power supply as well as transient current flow from an output filter capacitor.

In prior art DC power analyzers, a power supply is connected to a device under test (DUT) and the DUT is then turned "on". At such time, the DC power analyzer provides a measurement of the current flow into the DUT and thereby characterizes its power supply requirements. To provide the necessary current flow measurement, one or more resistances are placed in the return connection to enable measurement of the return current as a function of time.

Most if not all power analyzer power supplies include one or more capacitors connected in shunt across the power supply's output terminals. The use of current measurement resistors in the return circuit does not provide an accurate measure of the discharge current which flows from the charged capacitors into the load upon the load being rendered active.

Currently, many electronic devices are powered on a pulsed basis (e.g. cellular telephones), and in order to properly test such devices, an accurate measure is required of current flow into the load so as to determine whether the load meets manufacturing specifications.

Accordingly, it is an object of this invention to provide a power measurement circuit that provides a more accurate indication of current flow into a load.

It is another object of this invention to provide a power measurement analyzer which is particularly adapted to measurement of pulsed load currents from the power supply, including current supplied from one or more output filter capacitors.

SUMMARY OF THE INVENTION

A measurement system is provided for the measurement of current supply from a power source, wherein the power source provides a time-varying current, with certain portions thereof being supplied by discharge of an output capacitor. The measurement system includes a circuit for providing a supply voltage between a first terminal and a second terminal, with a sense resistor connected to the first terminal. A capacitor is coupled between the sense resistor and the second terminal and a current sensing circuit is coupled to the capacitor for sensing current flow therein and providing a first signal which is indicative thereof. At least one operational amplifier is coupled to the sense resistor and provides a signal that is indicative of voltage drop as a result of current flow therethrough. A summing amplifier is coupled to the current sense circuit and the operational amplifier and provides an output that is indicative of a sum of the first and second signals, thereby providing an indication of both power source output current and capacitor discharge current to a load connected between the first terminal and the second terminal.

BRIEF DESCRIPTION OF THE DRAWING

The drawing is a circuit diagram of a power measurement analyzer constructed in accordance with the invention.

DETAILED DESCRIPTION OF THE INVENTION

Referring now to the FIG., a power supply 10 provides its positive output to an output conductor 14. The negative or return terminal of power supply 10 is connected to return conductor 16 which includes series connected current measurement resistors 18 and 20. A device under test (DUT) 25 is connected between output terminals 22 and 24. An output filter capacitor 26 is connected between output terminals 22 and 24 and performs an output filtering function in the well-known manner.

A current transformer 28 is connected between capacitor 26 and return line 16 and provides an induced current flow through resistor 30 which is indicative of current flow through output capacitor 26. Current transformer 30 is connected to the negative input terminal of differential amplifier 32 whose positive input is connected to ground via a resistor 34. The output of differential amplifier 32 is connected to a calibrating/trim digital to analog converter 36 and thence through a resistance 38 to the negative input of differential amplifier 40.

The output of differential amplifier 40 is fed through a switch 42 to differential amplifier 44 and from there into an analog to digital converter 45 and to a microprocessor 48. Microprocessor 48, in turn, controls the state of switch 42 (as well as the switches 50 and 52). The input to switch 50 is derived from differential amplifier 54 which provides a current level output indicative of the current flow through low range resistance 20. In a similar manner, switch 52 receives an input from differential amplifier 56 which, in turn, measures the current flow through high range resistor 18. The output of differential amplifier 56 is further applied through summing resistor 57 to the negative input of differential amplifier 40.

As indicated above, measurement of current flow in conductor 16 via either low range resistance 20 or high range resistance 18 does not reflect the actual load current drawn when an output capacitor 26 is present and pulsed load currents are drawn. A significant portion of the initial transient load current is derived from discharge of capacitor 26, until the current flow from power supply 10 can respond.

In operation, microprocessor 48 selectively operates switches 42, 50 or 52 to accomplish various measurement modes. The closure of switch 52 enables current flow in high range resistance 18 to be measured and output via A/D converter 45 to microprocessor 48. The closure of switch 50 by microprocessor 48 enables current flow through low range resistance 20 to be measured.

In the case of a pulsed output measurement, microprocessor 48 closes switch 42. In such case, when DUT 25 is rendered active, the initial current flow into terminal 22 is derived from output capacitor 26. That current flow is reflected through current transformer 28 and resistance 30 to the input of differential amplifier 32. The output of differential amplifier 32 is fed through calibrating/trim D/A converter 36 and resistor 38 into the negative input of differential amplifier 40. As a result, a measure of the discharge current flow from output capacitor 26 out of terminal 22 and into the DUT, is applied to amplifier 40. Steady state current flow from power supply 10 is sensed by high range resistance 18 and is fed via differential amplifier 56 to the negative input to amplifier 40 through summing resister 57. As a result, amplifier 40 provides outputs which accurately reflect the entire current flow out of line 14, both during the transient early phase of a pulsed output and, later, during more steady state current flow.

The resulting output from amplifier 40 is fed via switch 42 to A/D converter 45 and is stored in the memory of microprocessor 48.

To obtain high accuracy, it is important that the gains of amplifiers 32 and 56 be matched. It is further important that the uncertainty or tolerance in the turns ratio of current transformer 28 be calibrated out. To accomplish this gain matching of current paths, initially switch 52 is closed. A DC current is programmed and calibrated with an external shunt. High range resistor 18, differential amplifier 56, amplifier 44 and A/D converter 45 are then calibrated.

A second calibration is then performed by microprocessor 48. With no external load across terminals 22, 24, only switch 42 is closed. Power supply 10 is programmed with a step voltage. The resulting ramp of current through output capacitor 26 and high range resistor 18 is reflected in amplifier 40. When the circuit gain through high range resistor 18 and amplifier 56 is matched to the circuit gain through current transformer 28, resistor 30, and amplifier 32, the unit is calibrated.

Since the circuit gain through resistor 18 and amplifier 56 have been calibrated, trimming is accomplished by the microprocessor 48 feeding digital correction signals to calibrating/trim A/D converter 36 which, in turn, applies a correction voltage to the output of amplifier 32 which tends to null the input into amplifier 40 from amplifier 52. In such manner, the gain paths are equalized.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A system for measuring a dc power supply output current into a load when the current includes capacitive discharge components, said system comprising:

means for providing a supply current between a first terminal and a second terminal;

sense resistor means connected to said first terminal;

capacitor means coupled between said first terminal and said second terminal;

current sense means coupled to said capacitor means for sensing current flow therein and for providing a first signal indicative thereof;

amplifier means coupled to said sense resistor means for providing a second signal indicative of a current flow-induced voltage across said sense resistor means; and summing means coupled to said current sense means and said amplifier means for providing an output that is indicative of a sum of said first signal and second signal.

2. The system as recited in claim 1 wherein said current sense means comprises a current transformer having an output connected to a second amplifier means which, in turn, provides an output to said summing means.

3. The system as recited in claim 2 further comprising:

calibration means for adjusting a gain of said current sense means to assure equal circuit gains are applied to signals input to said summing means.

4. The system as recited in claim 3 wherein said sense resistor means comprises a resistor connected in series to a return current path from a device under test.

5. The system as recited in claim 4, further comprising:

microprocessor means coupled to said summing means for storing a time series of outputs therefrom that are indicative of summed current sensed by said current sense means and said sense resistor means.

* * * * *